(12) United States Patent
Chen et al.

(10) Patent No.: US 11,942,436 B2
(45) Date of Patent: Mar. 26, 2024

(54) PASSIVATION SCHEME DESIGN FOR WAFER SINGULATION

(71) Applicant: Taiwan Semiconductor Manufacturing Co., Ltd., Hsinchu (TW)

(72) Inventors: Hsien-Wei Chen, Hsinchu (TW); Ying-Ju Chen, Tuku Township (TW); Ming-Fa Chen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/883,932

(22) Filed: Aug. 9, 2022

(65) Prior Publication Data

US 2022/0384261 A1    Dec. 1, 2022

Related U.S. Application Data

(62) Division of application No. 17/006,365, filed on Aug. 28, 2020, now Pat. No. 11,699,663.

(60) Provisional application No. 63/015,780, filed on Apr. 27, 2020.

(51) Int. Cl.

| | |
|---|---|
| *H01L 23/00* | (2006.01) |
| *H01L 21/74* | (2006.01) |
| *H01L 21/78* | (2006.01) |
| *H01L 23/31* | (2006.01) |
| *H01L 23/525* | (2006.01) |

(Continued)

(52) U.S. Cl.
CPC ............ *H01L 23/544* (2013.01); *H01L 21/74* (2013.01); *H01L 21/78* (2013.01); *H01L 23/3171* (2013.01); *H01L 23/525* (2013.01); *H01L 23/562* (2013.01); *H01L 23/585* (2013.01)

(58) Field of Classification Search
CPC ..... H01L 21/78; H01L 23/535; H01L 23/562; H01L 23/31; H01L 23/3171
See application file for complete search history.

(56) References Cited

U.S. PATENT DOCUMENTS

| | | |
|---|---|---|
| 8,669,641 B2 | 3/2014 | Hsieh et al. |
| 10,720,360 B2 | 7/2020 | Chang et al. |
| 2005/0167799 A1 | 8/2005 | Doan |

(Continued)

FOREIGN PATENT DOCUMENTS

| | | |
|---|---|---|
| CN | 101630657 A | 1/2010 |
| CN | 105448866 A | 3/2016 |

(Continued)

*Primary Examiner* — Reema Patel
(74) *Attorney, Agent, or Firm* — Slater Matsil, LLP

(57) ABSTRACT

A method of forming a semiconductor device includes: forming first electrical components in a substrate in a first device region of the semiconductor device; forming a first interconnect structure over and electrically coupled to the first electrical components; forming a first passivation layer over the first interconnect structure, the first passivation layer extending from the first device region to a scribe line region adjacent to the first device region; after forming the first passivation layer, removing the first passivation layer from the scribe line region while keeping a remaining portion of the first passivation layer in the first device region; and dicing along the scribe line region after removing the first passivation layer.

20 Claims, 15 Drawing Sheets

(51) Int. Cl.
*H01L 23/544* (2006.01)
*H01L 23/58* (2006.01)

(56) References Cited

U.S. PATENT DOCUMENTS

| | | |
|---|---|---|
| 2005/0184362 A1 | 8/2005 | Fujita |
| 2009/0283869 A1 | 11/2009 | Wu et al. |
| 2011/0127647 A1 | 6/2011 | Tsukakoshi et al. |
| 2012/0146234 A1 | 6/2012 | Beaupre et al. |
| 2012/0211748 A1 | 8/2012 | Miccoli et al. |
| 2013/0341800 A1* | 12/2013 | Tu .......................... H01L 24/15 |
| | | 257/774 |

FOREIGN PATENT DOCUMENTS

| | | |
|---|---|---|
| CN | 107665819 A | 2/2018 |
| DE | 102018100002 A1 | 1/2019 |
| EP | 0044048 A1 | 1/1982 |
| EP | 0068414 A2 | 1/1983 |
| EP | 0275588 A1 | 7/1988 |
| JP | 2010062465 A | 3/2010 |
| JP | 2011119324 A | 6/2011 |
| JP | 2013120767 A | 6/2013 |
| TW | I689980 B | 4/2020 |
| WO | 2016031521 A1 | 3/2016 |

* cited by examiner

PASSIVATION SCHEME DESIGN FOR WAFER SINGULATION

PRIORITY CLAIM AND CROSS-REFERENCE

This application is a divisional of U.S. patent application Ser. No. 17/006,365, filed Aug. 28, 2020, entitled "Passivation Scheme Design for Wafer Singulation," which claims the benefit of U.S. Provisional Application No. 63/015,780, filed on Apr. 27, 2020 and entitled "Passivation Scheme Design for SoIC Die Singulation Process," which applications are hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. As feature sizes continue to shrink in advanced semiconductor manufacturing nodes, new challenges arise that must be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
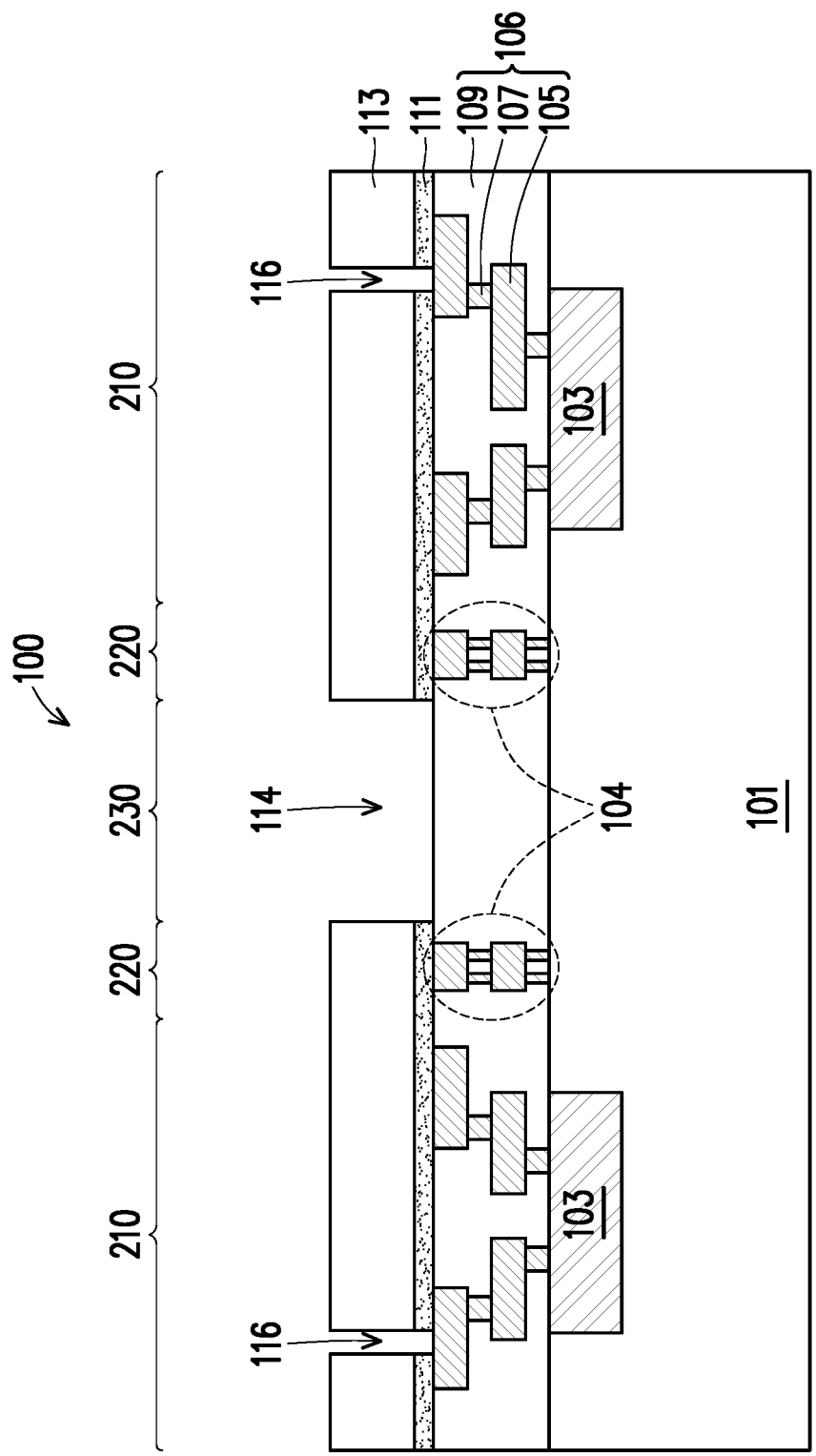
FIGS. 1-6 illustrate cross-sectional views of a semiconductor device at various stages of manufacturing, in accordance with an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion herein, unless otherwise specified, the same or similar reference numeral in different figures refers to the same or similar components formed by a same or similar process using a same or similar material(s).

In some embodiments, a method of forming a semiconductor device includes forming electrical components (e.g., transistors, resistors, capacitors, etc.,) in a substrate in a device region of the semiconductor device; forming an interconnect structure over and electrically coupled to the electrical components; and forming a passivation layer over the interconnect structure, the passivation layer extending from the device region to a scribe line region adjacent to the device region. The method further includes, after forming the passivation layer, removing the passivation layer from the scribe line region while keeping a remaining portion of the passivation layer in the device region; and dicing along the scribe line region after removing the passivation layer. In some embodiments, the passivation layer is a nitride-containing layer and the dicing process is a plasma dicing process. The etch rate of the nitride-containing passivation layer may be too low for the plasma dicing process. By removing the nitride-containing passivation layer from the dicing region, the plasma etching process may etch through the semiconductor device easily without the need for a thick mask layer to protect other areas of the semiconductor device.

FIGS. 1-6 illustrate cross-sectional views of a semiconductor device 100 at various stages of manufacturing, in accordance with an embodiment. The semiconductor device 100 may be, e.g., a wafer that comprises a plurality of semiconductor dies, which wafer is singulated later to form a plurality of individual semiconductor dies.

Referring to FIG. 1, the semiconductor device 100 includes a substrate 101, electrical components 103 formed in or on the substrate 101, and interconnect structures 106 formed over the substrate 101 and electrically coupled to the electrical components 103. As illustrated in FIG. 1, the semiconductor device 100 may include different regions, such as device regions 210, seal ring regions 220, and dicing regions 230 (may also be referred to as scribe line regions). In some embodiments, functional circuits, such as integrated circuits that includes electrical components 103 and the corresponding interconnect structures 106, are formed in the device regions 210. Seal rings 104 are formed in the seal ring regions 220 around the device regions 210. For example, each seal ring 104 may be formed in seal ring regions 220 around the perimeter of a respective device region 210. Each of the dicing regions 230 is disposed, e.g., between adjacent seal ring regions 220. During a subsequent dicing process, dicing is performed along (e.g., in) the dicing regions 230 to singulate the wafer into a plurality of individual semiconductor dies. Note that for simplicity, FIG. 1 may only show portions of the semiconductor device 100, and not all details of the semiconductor device 100 are illustrated.

The substrate 101 may be a semiconductor substrate, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Electrical components 103, such as transistors, diodes, capacitors, resistors, etc., may be formed in and/or on the substrate 101 using any suitable formation method(s), and may be interconnected by interconnect structures 106 to form functional circuits. For example, the electrical components 103 in each device region 210 are interconnected by the respective (e.g., overlying) interconnect structure 106 in that device region 210 to form the functional circuits of the integrated circuit die in the device region 210.

In some embodiments, each of the interconnect structures 106 includes metallization patterns (e.g., electrically conductive features) formed in one or more dielectric layers over the semiconductor substrate 101. For example, the interconnect structure 106 may include electrically conductive features, such as conductive lines 105 and vias 107 formed in a plurality of dielectric layers 109. In some embodiments, the dielectric layers 109 comprises a suitable dielectric material, such as silicon oxide, silicon nitride, silicon oxynitride, combinations thereof, multiple layers thereof, or the like, and may be formed using a suitable formation method such as chemical vapor deposition (CVD), physical vapor deposition (PVD), lamination, or the like. The electrically conductive features (e.g., 105, 107) of the interconnect structure 106 may be formed of an electrically conductive material, such as copper, and may be formed of a suitable formation method such as damascene, dual damascene, plating, or the like. Note that for simplicity, FIG. 1 illustrate the dielectric layer 109 as a single layer, with the understanding that the dielectric layer 109 of the interconnect structure 106 may include a plurality of dielectric layers.

FIG. 1 further illustrated seal rings 104 formed in the seal ring regions 220. As illustrated in FIG. 1, the seal rings 104 may include layers of vias and conductive lines formed in the dielectric layers 109. The seal rings 104 are formed in the same processing step(s) using the same material(s) as the conductive features 105/107, in some embodiments. In a top view, each seal ring 104 surrounds (e.g., encircles) a respective device region 210, in some embodiments. The seal ring 104 may protect the functional circuits in the device region 210 from mechanical stress and may also protect the functional circuits from damage due to cracking or peeling during the dicing process. In some embodiments, the seal rings 104 are electrically isolated, and therefore, do not perform any control or signal processing function.

Next, in FIG. 1, a passivation layer 111 is formed over the interconnect structures 106 in order to provide a degree of protection for the underlying structures. The passivation layer 111 may be formed of one or more suitable dielectric materials such as silicon oxide, silicon nitride, low-k dielectrics such as carbon doped oxides, extremely low-k dielectrics such as porous carbon doped silicon dioxide, combinations of these, or the like. The passivation layer 111 may be formed through a process such as CVD, although any suitable process may be utilized. In an example embodiment, the passivation layer 111 is formed of a nitride-containing material (e.g., silicon nitride). The passivation layer 111 may be blanket formed over the interconnect structures 106 and therefore, the as-deposited passivation layer 111 may extend continuously from a first device region 210 (e.g., the device region 210 on the left in FIG. 1) to a second device region 210 (e.g., the device region 210 on the right in FIG. 1), thus covering the uppermost surface of the dielectric layers 109 in the device regions 210, the seal ring regions 220, and the dicing regions 230.

Next, a patterned mask 113, such as a patterned photoresist layer, is formed over the passivation layer 111. An anisotropic etching process, such as dry etching, may be performed using the patterned mask 113 as the etching mask to remove portions of the passivation layer 111. After the anisotropic etching process, openings 116 are formed in the passivation layer 111 in the device regions 210 to expose underlying conductive features of the interconnect structures 106. In addition, openings 114 are formed in the passivation layer 111 in the dicing regions 230 to expose the underlying dielectric layer 109. Note that in subsequent processing, the openings 116 are filled with an electrically conductive material(s) to form via portions 115V (see FIG. 2) of the subsequently formed conductive pads 115, thus may have a suitable shape such as a circular shape, an oval shape, a rectangular shape, or the like, in a top view. In contrast, the purpose of forming the openings 114 is to remove portions of the passivation layer 111 from the dicing region 230, such that it is easier to singulate the semiconductor device 100 in a subsequent plasma dicing process, details of which are discussed below. Therefore, when viewed from the top (e.g., in a top view), each of the openings 114 is a trench extending along (e.g., in) the dicing region 230. For this reason, the openings 114 may also be referred to as trenches. After the openings 114/116 are formed, the patterned mask 113 is removed by a suitable removal process, such as ashing.

Figure 2:
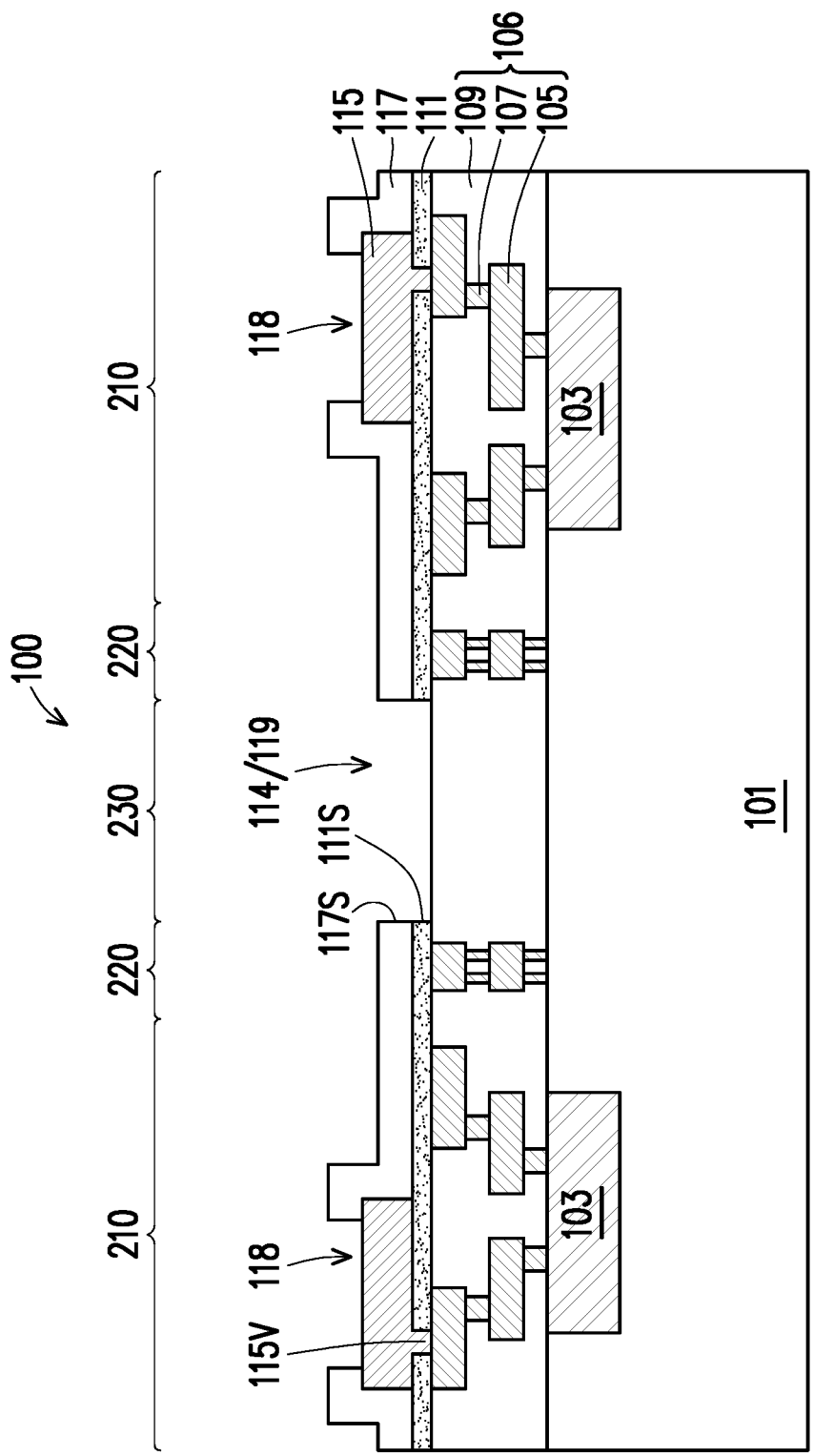

Referring next to FIG. 2, conductive pads 115 are formed in the device regions 210 over the passivation layer 111 and electrically coupled to underlying electrically conductive features of the interconnect structures 106. The conductive pads 115 may comprise aluminum, but other materials, such as copper, may alternatively be used. The conductive pads 115 may be formed by depositing (e.g., using sputtering) a layer of electrically conductive material (e.g., aluminum) over the passivation layer 111 and in the openings 116 (see FIG. 1) of the passivation layer 111, then removing portions of the layer of electrically conductive material through a suitable process (such as photolithography and etching techniques) to form the conductive pads 115. However, any other suitable process may be utilized to form the conductive pads 115. In the example of FIG. 2, the conductive pads 115 include via portions 115V that extends into the passivation layer 111 to electrically couple to the conductive features of the interconnect structure 106. The conductive pads 115 may be used to test the functional circuits of the semiconductor device 100 to identify known good dies (KGDs).

Next, a passivation layer 117 is formed (e.g., conformally formed) over the passivation layer 111, the conductive pads 115, and the interconnect structure 106. The passivation layer 117 may be formed of one or more suitable dielectric materials such as silicon oxide, silicon nitride, low-k dielectrics such as carbon doped oxides, extremely low-k dielectrics such as porous carbon doped silicon dioxide, combinations of these, or the like. The passivation layer 117 may be formed through a process such as CVD, although any suitable process may be utilized. In an example embodiment, the passivation layer 117 is formed of a nitride-containing material (e.g., silicon nitride). The passivation layer 117 may be blanket formed, and therefore, the as-deposited passivation layer 117 may extend continuously from a first device region 210 (e.g., the device region 210 on the left in FIG. 2) to a second device region 210 (e.g., the device region 210 on the right in FIG. 2), thus covering the conductive pads 115, the passivation layer 111, and the uppermost surface of the dielectric layers 109 in the dicing regions 230.

Next, a patterned mask, such as a patterned photoresist layer, is formed over the passivation layer 117, and an anisotropic etching process, such as dry etching, is performed to remove portions of the passivation layer 117. The patterned mask layer is then removed after the anisotropic etching process. After the anisotropic etching process, openings 118 are formed in the passivation layer 117 in the device regions 210 to expose the conductive pads 115. In addition, portions of the passivation layer 117 are removed from the dicing regions 230, and openings 119 (e.g., trenches) are formed to expose the underlying dielectric layer 109 in the dicing regions 230. In the example of FIG. 2, sidewalls 117S of the passivation layer 117 facing the dicing region 230 and respective sidewalls 111S of the passivation layer 111 facing the dicing region 230 are aligned (e.g., along the same vertical lines), and the openings 119 have a same dimension as the openings 114. In other words, in a top view, each of the openings 119 is a trench that overlaps with a respective (e.g., underlying) opening 114.

Figure 3:
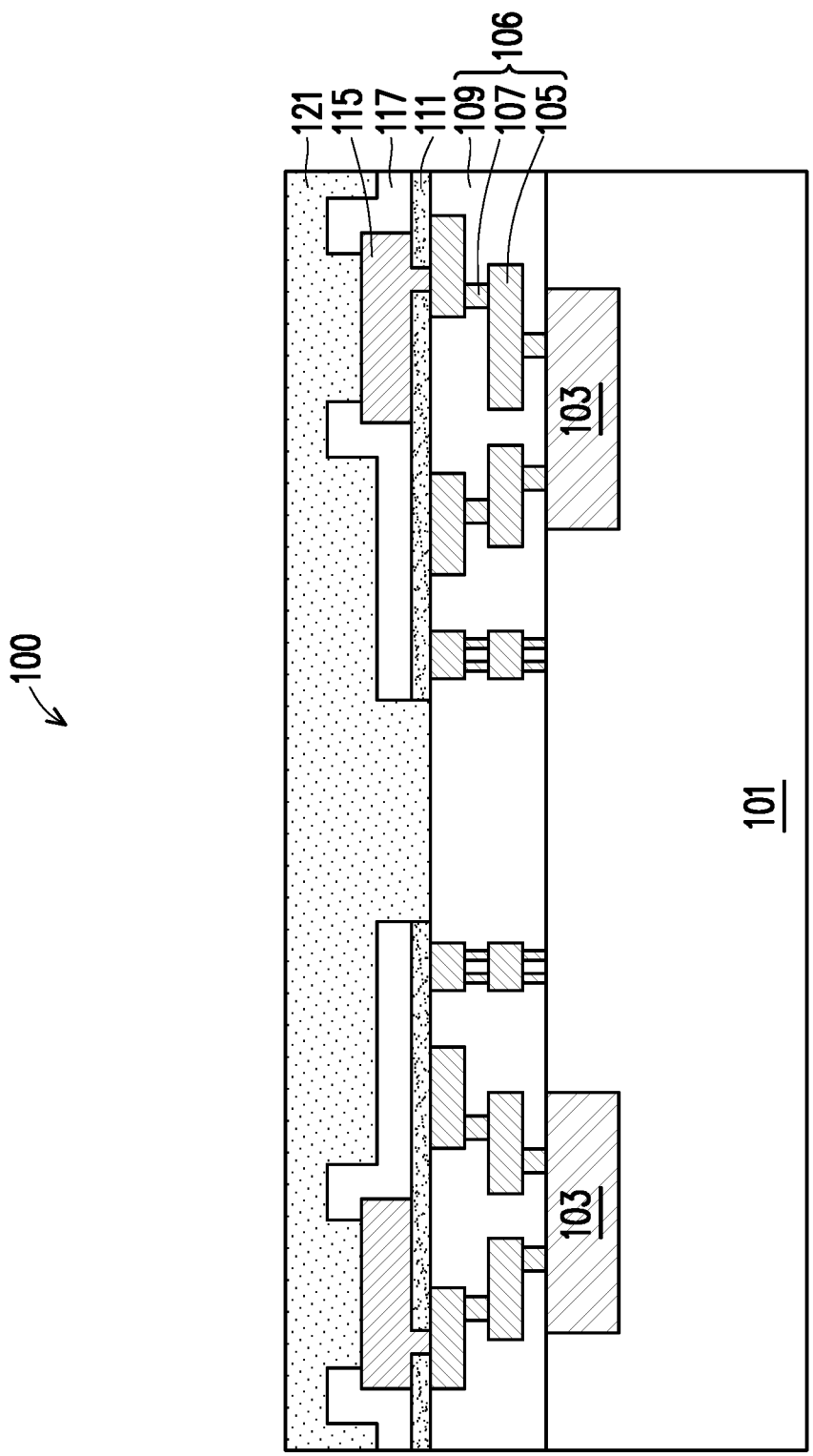

Next, in FIG. 3, a dielectric layer 121, such as silicon oxide, is formed over the structure of FIG. 2, using a suitable formation method such as CVD, PVD, or the like. A planarization process, such as chemical and mechanical planarization (CMP), may be performed to achieve a level upper surface for the dielectric layer 121.

Figure 4:
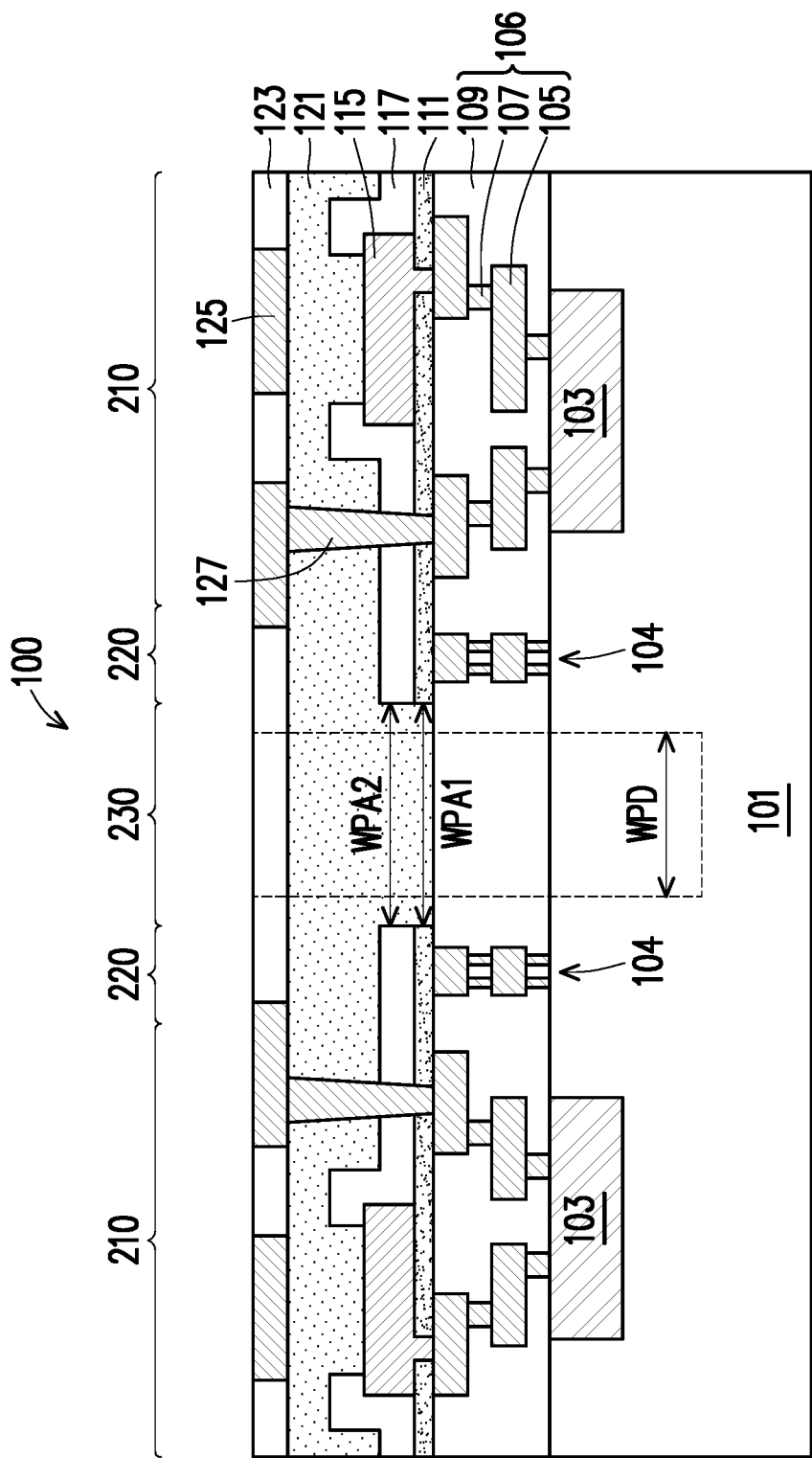

Next, in FIG. 4, a dielectric layer 123, such as silicon oxide, is formed over the dielectric layer 121, using a suitable formation method such as CVD, PVD, or the like. Conductive pads 125 are formed in the dielectric layer 123, and vias 127 are formed to extend through the dielectric layer 121 and the passivation layers 117/111 to electrical couple the conductive pads 125 with conductive features of the interconnect structures 106. The vias 127 may also be formed to electrical couple the conductive pads 125 with the conductive pads 115. The conductive pads 125 and the vias 127 may be formed of a suitable conductive material, such as copper, gold, tungsten, cobalt, alloys thereof, combinations thereof, or the like, using a suitable method known or used in the industry.

In the example of FIG. 4, a distance WPA2, measured between opposing sidewalls of the passivation layer 117 facing the dicing region 230, is the same as a distance WPA1, measured between opposing sidewalls of the passivation layer 111 facing the dicing region 230. The dashed lines in FIG. 4 further illustrate a dicing path in the dicing region 230 for a subsequent plasma dicing process. A width WPD of the dicing path is smaller than WPA1 or WPA2, in the illustrated embodiment. In some embodiments, a difference between the width WPD and the distances WPA1 and WPA2 is less than 2 µm (e.g., 0<WPA1−WPD<2 µm, and WPA1=WPA2). In the discussion herein, the distance WPA1 may also be referred to as the width of the opening 114 in the passivation layer 111, and the distance WPA2 may also be referred to as the width of the opening 119 in the passivation layer 117.

Figure 5:
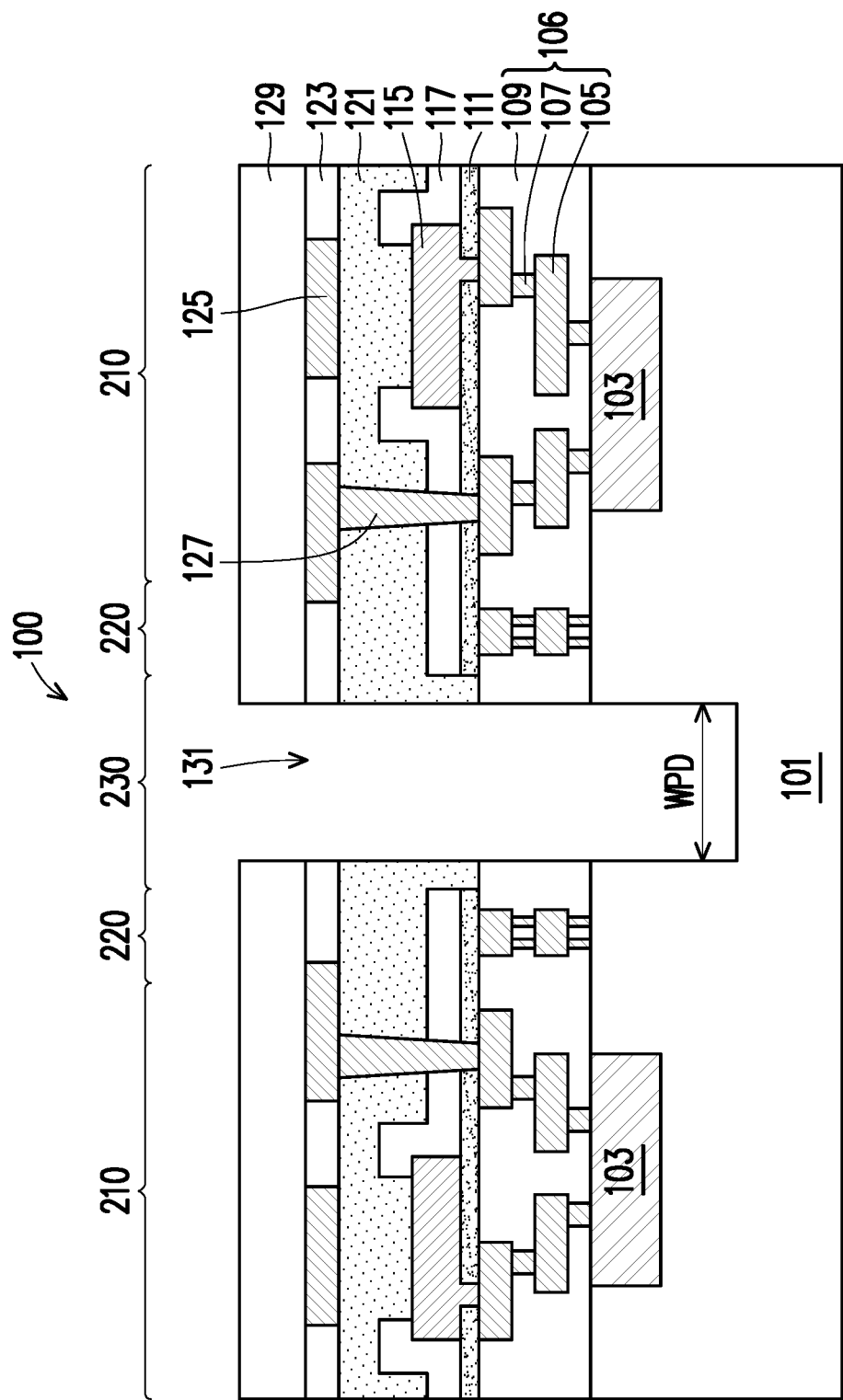

Next, in FIG. 5, a patterned mask 129, such as patterned photoresist layer, is formed over the structure of FIG. 4. Next, a dicing process, such as a plasma dicing process, is performed along the dicing paths in the dicing regions 230 to form recesses 131 (e.g., trenches in a top view). The plasma dicing process etches portions of the semiconductor device 100 exposed by the patterns (e.g., openings) in the patterned mask 129. As illustrated in FIG. 5, the recess 131 extends through the dielectric layers 123/121/109 and into the substrate 101. A bottom of the recess 131 is between an upper surface and a lower surface of the substrate 101. In other words, the recess 131 extends into, but not through, the substrate 101 in FIG. 5.

In some embodiments, the plasma dicing is a dry plasma process such as Deep Reactive Ion Etching (DRIE), which can etch very narrow, deep vertical trenches into the substrate to separate individual dies. Issues with dicing using a blade, such as die chipping or cracking, may be avoided by the plasma dicing process, thereby improving the yield of the manufacturing process. Unlike dicing using a blade, plasma dicing avoids or reduces damage to the wafer surface and/or sidewalls, resulting in greater die strengths, improved device reliability, and increased device lifetime. Due to the narrower dicing path of the plasma dicing, the dicing regions may be made narrower, thus allowing for more dies to be formed in the wafer to reduce production cost per die. In addition, plasma dicing may be performed along multiple dicing paths simultaneously, thus increasing the throughput of the manufacturing process. Furthermore, by defining the shape of the openings in the patterned mask 129, non-rectangular die shapes are easily achieved using plasma dicing.

In some embodiments, the passivation layers 111/117 are nitride-containing layers, and the etch rate of the passivation layers 111/117 using the plasma dicing process (e.g., a plasma etching process) is low. If the passivation layers 111/117 were not removed from the dicing regions 230, a long plasma etching time may be needed to etch through the passivation layers 111/117, which in turn requires a very thick patterned mask 129 (e.g., a thick patterned photoresist layer) to protect other areas of wafer, e.g., the device regions 210. Due to the high etch rate of photoresist layer, there may not be enough photoresist budget to accommodate the thickness of the patterned mask 129 (e.g., photoresist layer) required. The present disclosure, by removing the passivation layers 111/117 from the dicing regions 230, allows the plasma dicing process to etch through the semiconductor device 100 at a faster rate, thereby obviating the need for a very thick patterned mask 129 and increasing the throughput of the manufacturing process.

Figure 6:
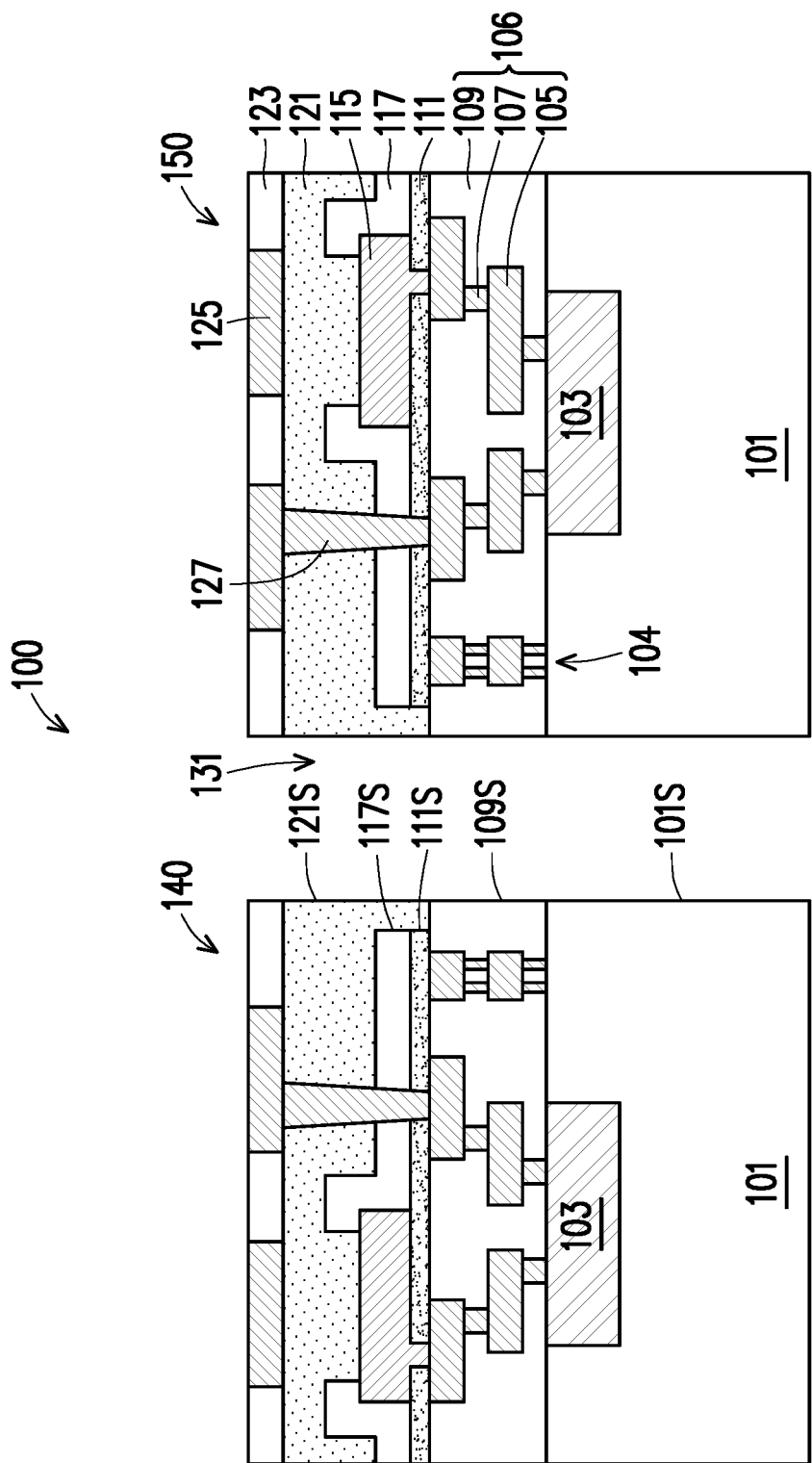

Next, in FIG. 6, the thickness of the substrate 101 is reduced. A backside grinding process, such as CMP, may be performed from the backside of the substrate 101 (e.g., the side facing away from the interconnect structures 106) to reduce the thickness of the substrate 101. In some embodiments, the grinding process stops when the recesses 131 extends through the (thinned) substrate 101, therefore separating the semiconductor device 100 (e.g., a wafer) into a plurality of individual semiconductor dies 140/150. In the illustrated embodiment, each semiconductor die 140/150 includes electrical components 103 formed in the substrate 101, an overlying interconnect structure 106, passivation layers 111/117, dielectric layers 121/123, conductive pads 115/125, and vias 127. Note that for simplicity, FIG. 6 only illustrates portions of the semiconductor dies 140/150 (e.g., portions adjacent to the recess 131 in FIG. 6).

In the example of FIG. 6, the sidewall 117S of the passivation layer 117 and the respective sidewall 111S of the passivation layer 111 are aligned along a same vertical line, and there is a lateral distance (e.g., offset) between the sidewalls 117S/111S and a respective (e.g., a closest) sidewall 121S of the dielectric layers 121. The sidewall 121S is aligned along a same vertical line with a respective (e.g., a closest) sidewall 101S of the substrate 101, and aligned along a same vertical line with a respective (e.g., a closest) sidewall 109S of the dielectric layer 109, in the illustrated embodiment.

Figure 7:
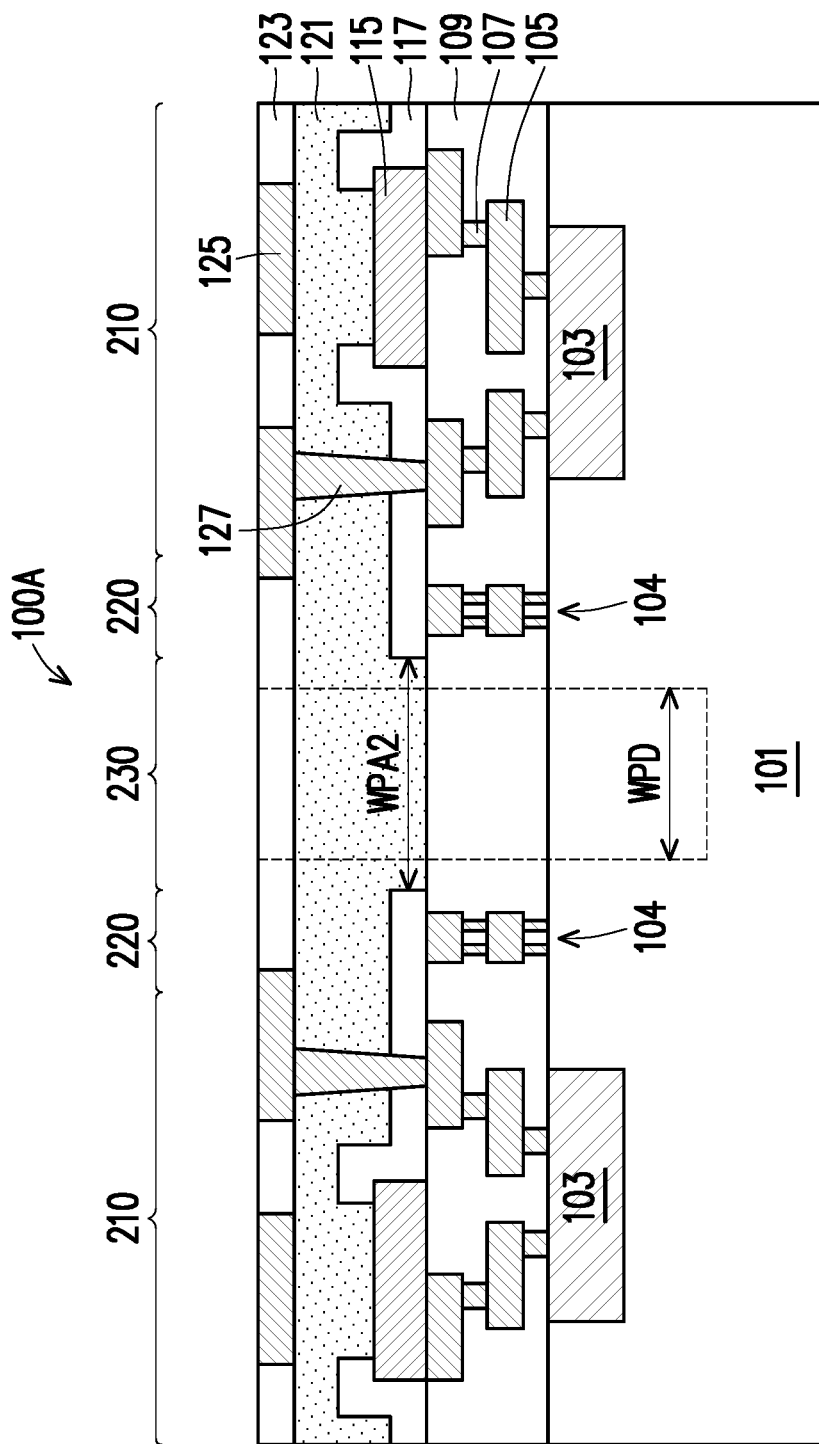
FIGS. 7 and 8 illustrate cross-sectional views of a semiconductor device at various stages of manufacturing, in accordance with another embodiment.
Figure 8:
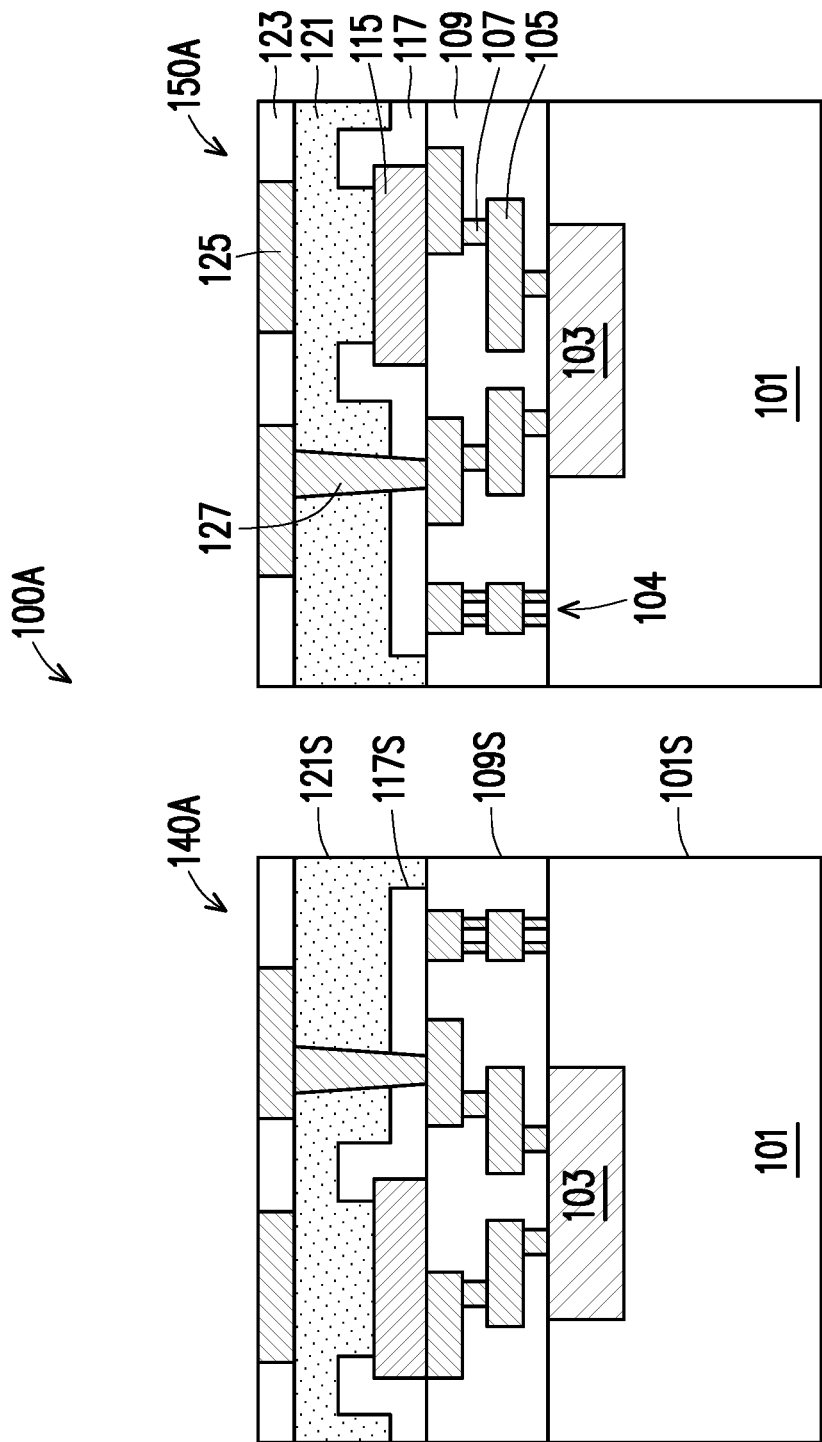

FIGS. 7 and 8 illustrate cross-sectional views of a semiconductor device 100A at various stages of manufacturing, in accordance with another embodiment. The semiconductor device 100A of FIG. 7 is similar to the semiconductor device 100 of FIG. 4, but the passivation layer 111 is omitted in the example of FIG. 7. FIG. 7 further illustrates the dicing path with a width WPD smaller than the width WPA2 of the opening (e.g., a trench in top view) in the passivation layer 117 in the dicing region 230. FIG. 8 illustrates the semiconductor device 100A after the plasma dicing process and backside thinning process, similar to FIG. 6. The semiconductor device 100A is singulated into a plurality of individual semiconductor dies 140A and 150A.

Figure 9:
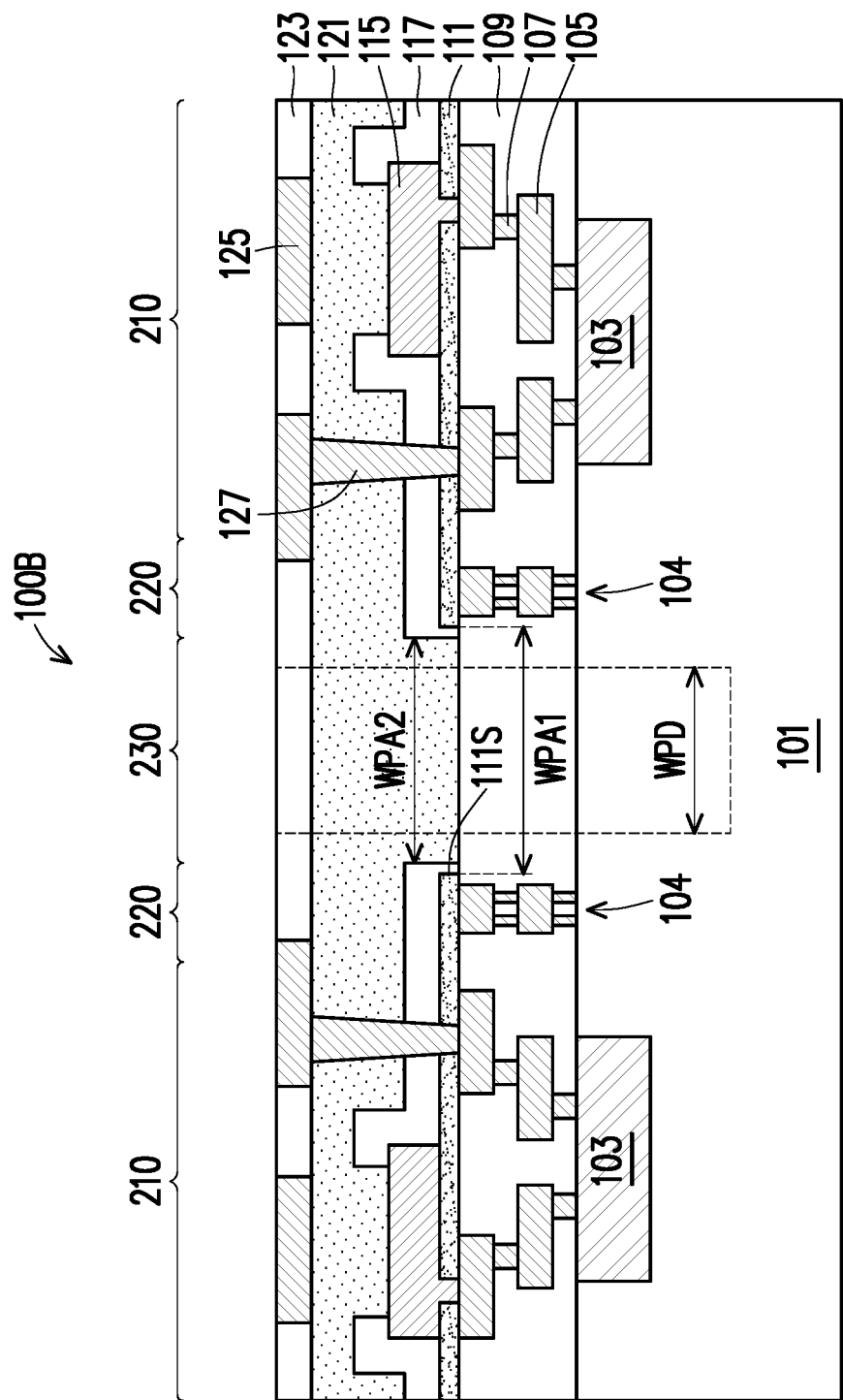
FIGS. 9 and 10 illustrate cross-sectional views of a semiconductor device at various stages of manufacturing, in accordance with another embodiment.
Figure 10:
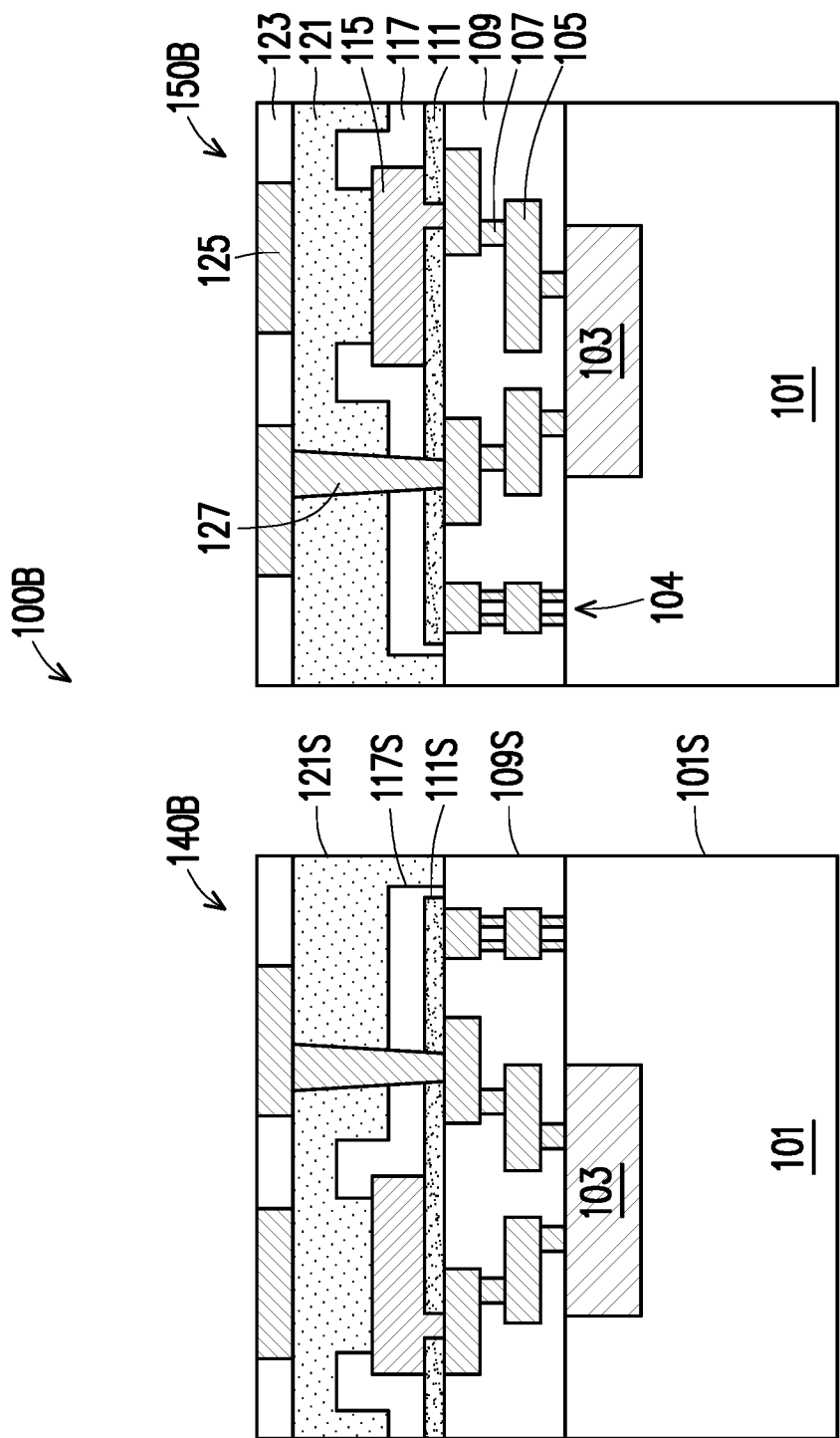

FIGS. 9 and 10 illustrate cross-sectional views of a semiconductor device 100B at various stages of manufacturing, in accordance with another embodiment. The semiconductor device 100B of FIG. 9 is similar to the semiconductor device 100 of FIG. 4, but the width WPA2 of the opening in the passivation layer 117 is smaller than the width WPA1 of the opening in the passivation layer 111, such that the passivation layer 117 covers sidewalls 111S of the passivation layer 111. In some embodiments, during the patterning process to form openings 119 in the passivation layer 117 (see, e.g., FIG. 2), the size (e.g., width) of the openings 119 are formed to be smaller than that of the opening 114 of the passivation layer 111, which results in the shapes of the passivation layers 111/117 illustrated in FIG. 9. FIG. 9 further illustrates the dicing path with the width WPD, which is smaller than the width WPA2 and the width WPA1. In some embodiments, a difference between the widths WPA1 and WPA2 is less than 1 μm (e.g., 0<WPA1−WPA2<1 μm), and a difference between the widths WPA2 and WPD is less than 2 μm (e.g., 0<WPA2−WPD<2 μm).

FIG. 10 illustrates the semiconductor device 100B after the plasma dicing process and backside thinning process, similar to FIG. 6. The semiconductor device 100B is singulated into a plurality of individual semiconductor dies 140B and 150B. In the example of FIG. 10, there is a lateral distance (e.g., offset) between the sidewall 117S of the passivation layer 117 and the respective sidewall 111S of the passivation layer 111. For example, the sidewall 1117S is closer to a respective (e.g., closest) sidewall 121S of the dielectric layers 121 than the sidewall 111S. The sidewall 121S is aligned along a same vertical line with the sidewall 101S of the substrate 101, and aligned along a same vertical line with a respective (e.g., a closest) sidewall 109S of the dielectric layer 109, in the illustrated embodiment.

Figure 11:
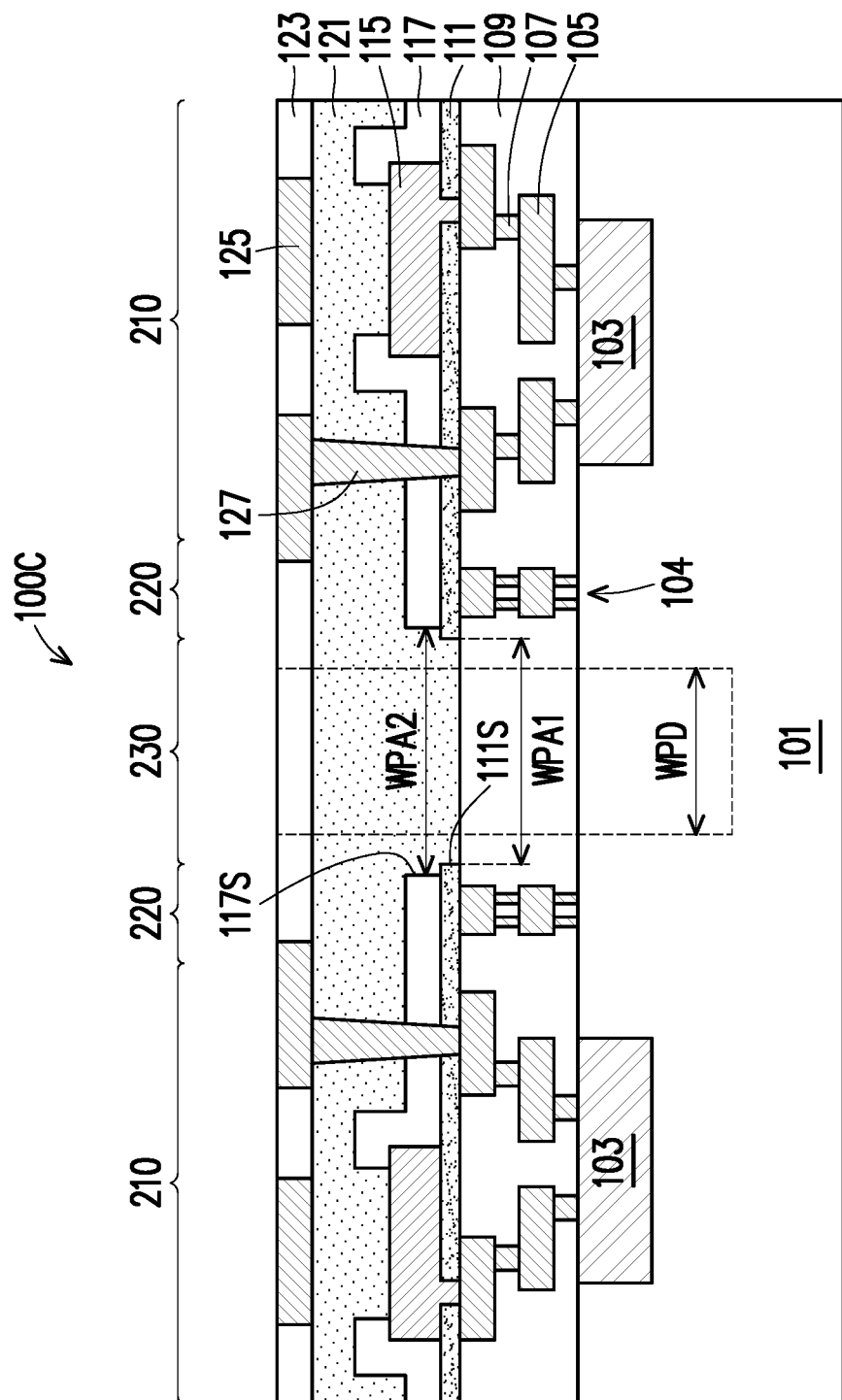
FIGS. 11 and 12 illustrate cross-sectional views of a semiconductor device at various stages of manufacturing, in accordance with another embodiment.
Figure 12:
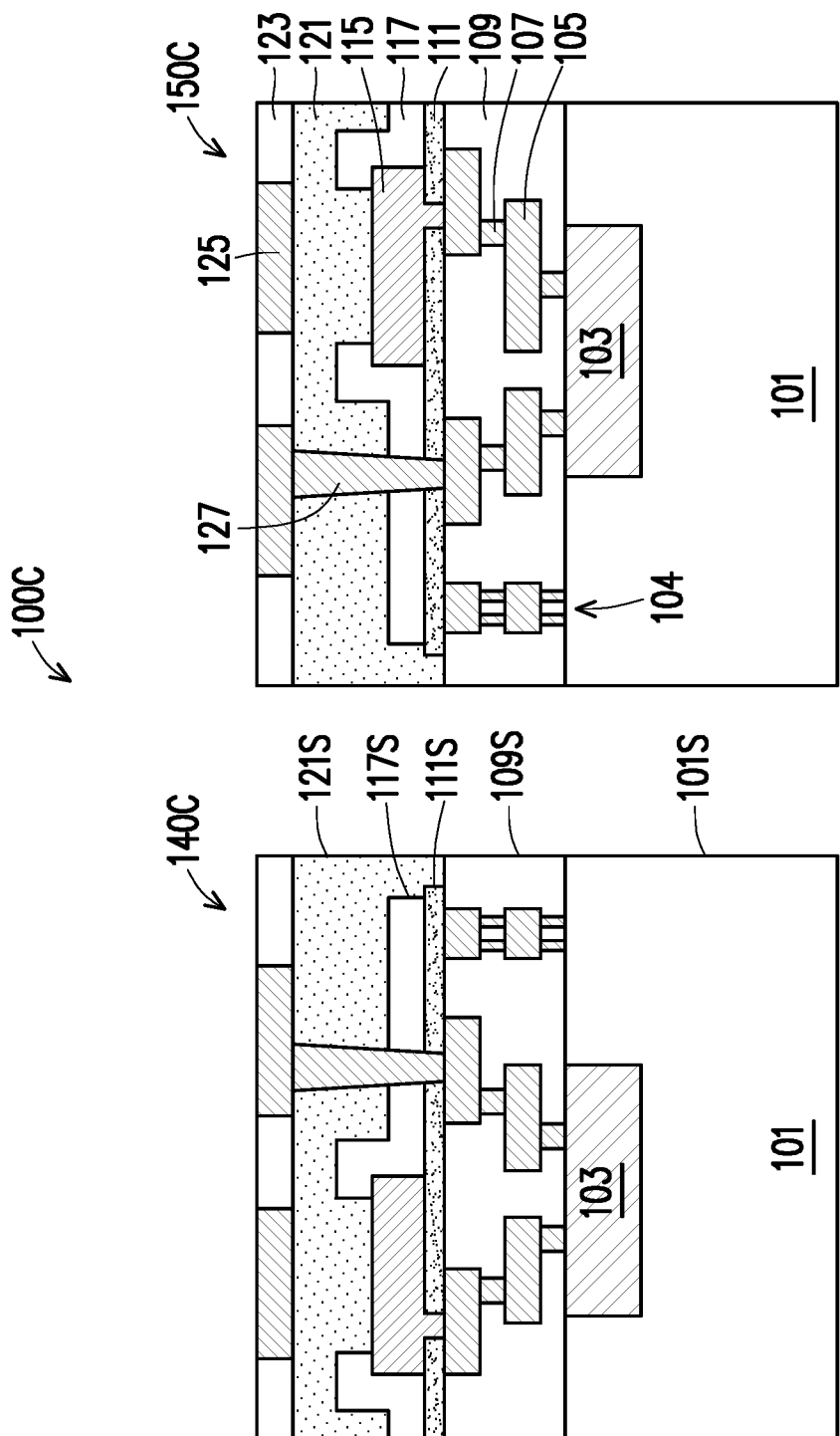

FIGS. 11 and 12 illustrate cross-sectional views of a semiconductor device 100C at various stages of manufacturing, in accordance with another embodiment. The semiconductor device 100C of FIG. 11 is similar to the semiconductor device 100 of FIG. 4, but the width WPA2 of the opening in the passivation layer 117 is larger than the width WPA1 of the opening in the passivation layer 111, such that the sidewall 117S of the passivation layer 117 is further away from the dicing region 230 than the corresponding sidewall 111S of the passivation layer 111. In some embodiments, during the patterning process to form openings 119 in the passivation layer 117 (see, e.g., FIG. 2), the size (e.g., width) of the openings 119 are formed to be larger than that of the opening 114 of the passivation layer 111, which results in the shapes of the passivation layers 111/117 illustrated in FIG. 11. FIG. 11 further illustrates the dicing path with the width WPD, which is smaller than the width WPA2 and the width WPA1. In some embodiments, a difference between the widths WPA1 and WPA2 is less than 1 μm (e.g., 0<WPA2−WPA1<1 μm), and a difference between the widths WPA1 and WPD is less than 2 μm (e.g., 0<WPA1−WPD<2 μm).

FIG. 12 illustrates the semiconductor device 100C after the plasma dicing process and backside thinning process, similar to FIG. 6. The semiconductor device 100C is singulated into a plurality of individual semiconductor dies 140C and 150C. In the example of FIG. 12, there is a lateral distance (e.g., offset) between the sidewall 117S of the passivation layer 117 and the respective sidewall 111S of the passivation layer 111. For example, the sidewall 1117S is further from a respective (e.g., closest) sidewall 121S of the dielectric layers 121 than the sidewall 111S. The sidewall 121S is aligned along a same vertical line with the sidewall 101S of the substrate 101, and aligned along a same vertical line with a respective (e.g., a closest) sidewall 109S of the dielectric layer 109, in the illustrated embodiment.

Figure 13:
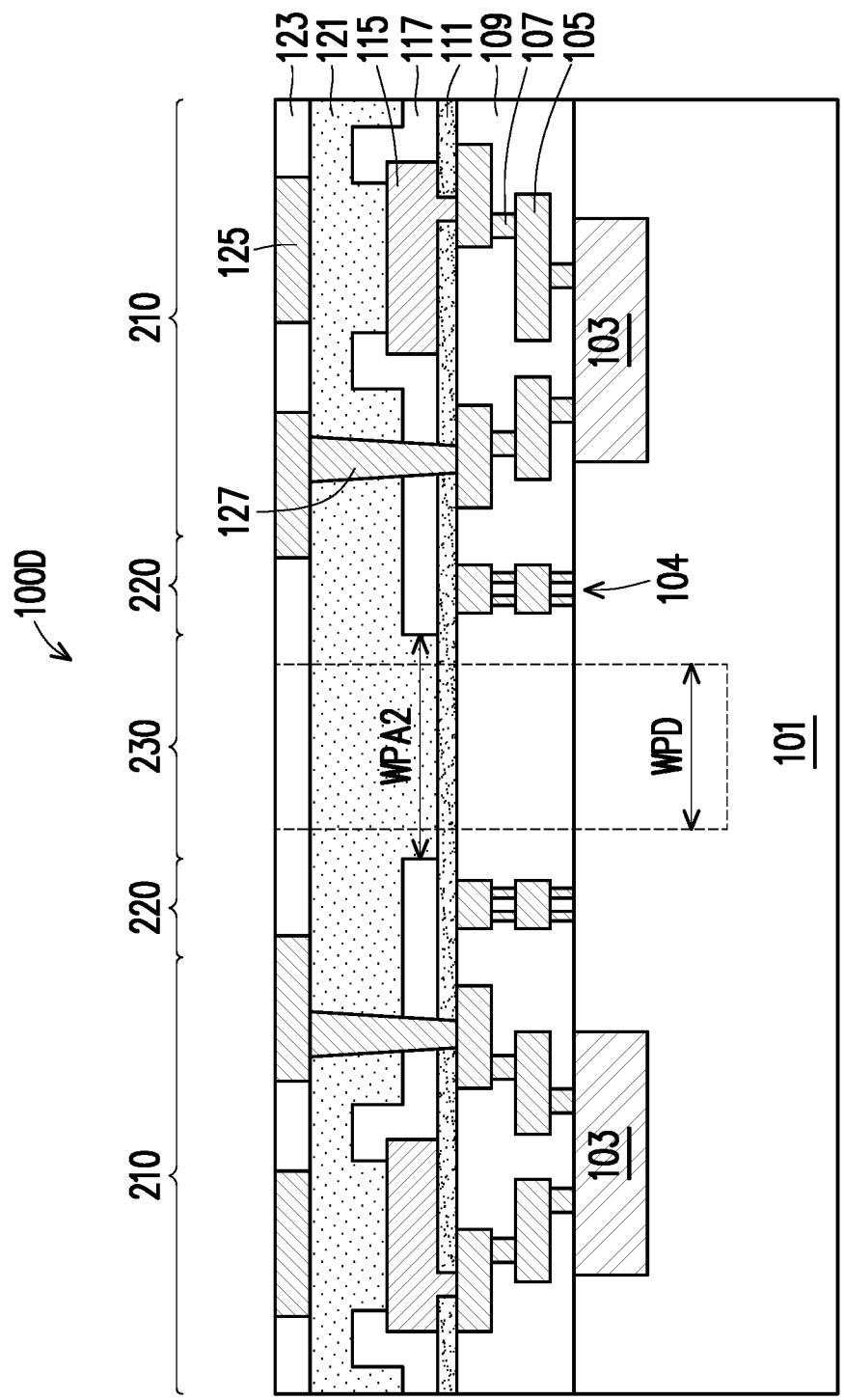
FIGS. 13 and 14 illustrate cross-sectional views of a semiconductor device at various stages of manufacturing, in accordance with yet another embodiment.
Figure 14:
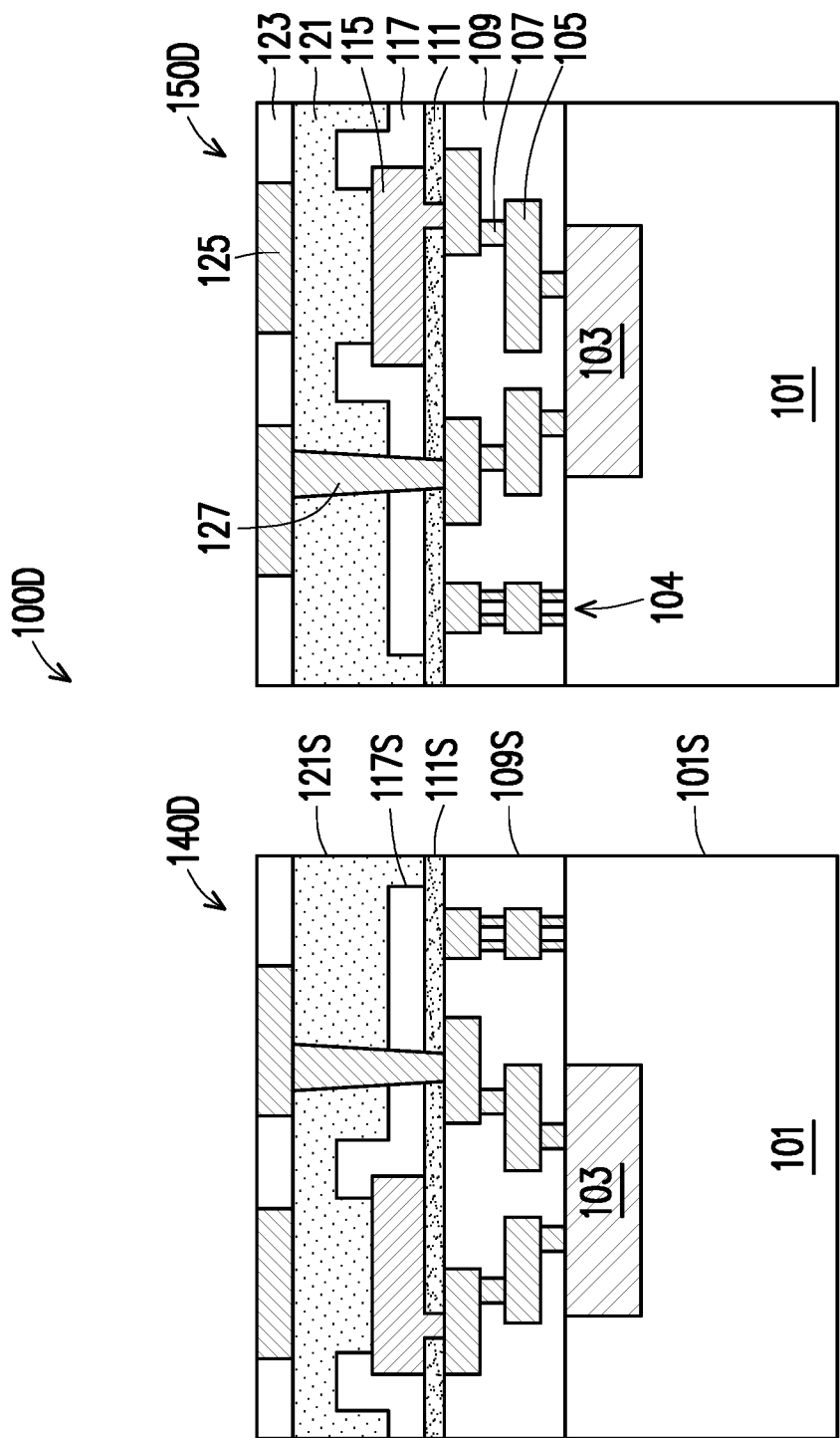

FIGS. 13 and 14 illustrate cross-sectional views of a semiconductor device 100D at various stages of manufacturing, in accordance with yet another embodiment. The semiconductor device 100D of FIG. 13 is similar to the semiconductor device 100 of FIG. 4, but the passivation layer 111 is not removed from (thus remains in) the dicing regions 230, and the passivation layer 117 is removed from the dicing region 230. This embodiment may be used when the thickness of the passivation layer 111 is small (e.g., smaller than 8000 nm) and/or the passivation layer 111 is formed of a material having a high etch rate (e.g., etch rate higher than 200 nm per minute (nm/min), such as between about 200 nm/min and about 1000 nm/min) for the plasma dicing process, in which case only openings 119 (see label in FIG. 2) are formed in the passivation layer 117 with a width WPA2. FIG. 13 further illustrates the dicing path with the width WPD smaller than the width WPA2. In some embodiments, a difference between the widths WPA2 and WPD is less than 2 μm (e.g., 0<WPA2−WPD<2 μm).

FIG. 14 illustrates the semiconductor device 100D after the plasma dicing process and backside thinning process, similar to FIG. 6. The semiconductor device 100D is singulated into a plurality of individual semiconductor dies 140D and 150D. In the example of FIG. 14, there is a lateral distance (e.g., offset) between the sidewall 117S of the passivation layer 117 and the sidewall 111S of the passivation layer 111. For example, the sidewall 1117S is further from a respective (e.g., closest) sidewall 121S of the dielectric layers 121 than the sidewall 111S. The sidewall 111S of the passivation layer 111, the sidewall 121S of the dielectric layer 121, the sidewall 109S of the dielectric layers 109, and the sidewall 101S of the substrate 101 are aligned along a same vertical line, in the illustrated embodiment.

Figure 15:
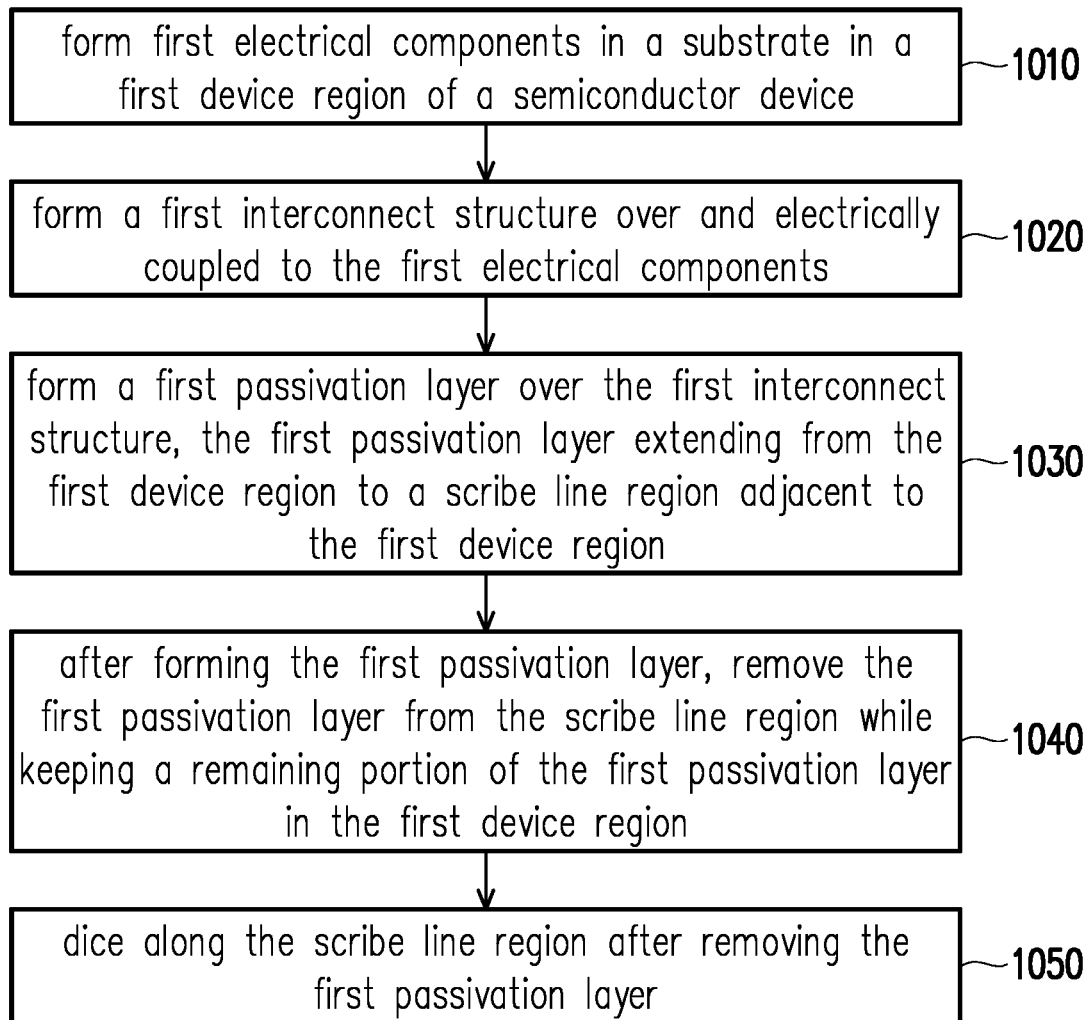
FIG. 15 illustrates a flow chart of a method of forming a semiconductor device, in accordance with some embodiments.

FIG. 15 illustrates a flow chart of a method 1000 of forming a semiconductor device, in accordance with some embodiments. It should be understood that the embodiment method shown in FIG. 15 is merely an example of many possible embodiment methods. One of ordinary skill in the art would recognize many variations, alternatives, and modifications. For example, various steps as illustrated in FIG. 15 may be added, removed, replaced, rearranged, or repeated.

Referring to FIG. 15, at block 1010, first electrical components are formed in a substrate in a first device region of the semiconductor device. At step 1020, a first interconnect structure is formed over and electrically coupled to the first electrical components. At step 1030, a first passivation layer is formed over the first interconnect structure, the first passivation layer extending from the first device region to a scribe line region adjacent to the first device region. At step 1040, after forming the first passivation layer, the first passivation layer is removed from the scribe line region while a remaining portion of the first passivation layer is kept in the first device region. At step 1050, a dicing process is performed along the scribe line region after removing the first passivation layer.

Embodiments may achieve advantages. For example, by removing the passivation layers 111 and/or 117 in the dicing region, it is easier for plasma dicing process to etch through the dicing region of the wafer, thereby obviating the need to form a thick photoresist layer for protection of other areas of the wafer. This allows plasma dicing process to be used for singulation of the wafer with hard-to-etch (e.g., nitride-containing) passivation layers. The use of plasma dicing process increases the throughput of the dicing process, since multiple dicing regions can be etched by the plasma dicing process simultaneously. By designing the shape of the openings in the patterned mask layer used in the plasma dicing process, non-rectangular shaped dies can be formed easily. In addition, plasma dicing reduces or avoids damage to the die, which results in greater die strengths, improved device reliability, and increased device lifetime.

In accordance with an embodiment, a method of forming a semiconductor device includes: forming first electrical components in a substrate in a first device region of the semiconductor device; forming a first interconnect structure over and electrically coupled to the first electrical components; forming a first passivation layer over the first interconnect structure, the first passivation layer extending from the first device region to a scribe line region adjacent to the first device region; after forming the first passivation layer, removing the first passivation layer from the scribe line region while keeping a remaining portion of the first passivation layer in the first device region; and dicing along the scribe line region after removing the first passivation layer. In an embodiment, the method further includes, before forming the first passivation layer, forming a first seal ring in a first seal ring region between the first device region and the scribe line region. In an embodiment, after removing the first passivation layer from the scribe line region, the first seal ring region remain covered by the first passivation layer. In an embodiment, the dicing is performed along a dicing path in the scribe line region, wherein a width of the dicing path is smaller than a width of the scribe line region. In an embodiment, the dicing forms a recess in the substrate, wherein a bottom of the recess is between a first side of the substrate facing the first interconnect structure and a second side of the substrate opposing the first side of the substrate. In an embodiment, the dicing is performed using a plasma dicing process. In an embodiment, the method further includes, after the dicing, reducing a thickness of the substrate from the second side of the substrate, wherein after reducing the thickness of the substrate, the recess extends through the substrate. In an embodiment, the method further includes, after removing the first passivation layer from the scribe line region and before the dicing: forming a conductive pad through the first passivation layer and electrically coupled to an electrically conductive feature of the first interconnect structure; forming a second passivation layer over the conductive pad and over the first passivation layer, wherein the second passivation layer extends from the first device region to the scribe line region; and removing the second passivation layer from the scribe line region while keeping a remaining portion of the second passivation layer in the first device region. In an embodiment, after removing the second passivation layer from the scribe line region, a first sidewall of the first passivation layer facing the scribe line region and a second sidewall of the second passivation layer facing the scribe line region are aligned along a same line. In an embodiment, after removing the second passivation layer from the scribe line region, a first sidewall of the first passivation layer facing the scribe line region is closer to the scribe line region than a second sidewall of the second passivation layer facing the scribe line region. In an embodiment, after removing the second passivation layer from the scribe line region, a first sidewall of the first passivation layer facing the scribe line region is further from the scribe line region than a second sidewall of the second passivation layer facing the scribe line region. In an embodiment, the method further includes: forming second electrical components in the substrate in a second device region of the semiconductor device, the scribe line region being between the first device region and the second device region; and forming a second interconnect structure over and electrically coupled to the second electrical components, wherein forming the first passivation layer comprising forming the first passivation layer to extend continuously from the first device region to the second device region, wherein after removing the first passivation layer from the scribe line region, the first passivation layer covers an upper surface of the first interconnect structure and covers an upper surface of the second interconnect structure.

In accordance with an embodiment, a method of forming a semiconductor device includes: forming a first interconnect structure and a second interconnect structure over a substrate in a first device region and a second device region of the semiconductor device, respectively, wherein a scribe line region of the semiconductor device is interposed between the first device region and the second device region; forming a first passivation layer over the first interconnect structure and over the second interconnect structure, wherein the first passivation layer extends continuously from the first device region to the second device region; removing a first portion of the first passivation layer from the scribe line region; and after removing the first passivation layer from the scribe line region, performing a plasma dicing process to form a trench in the scribe line region that extends into the substrate from a first side of the substrate facing the first passivation layer. In an embodiment, the first passivation layer is formed of a nitride-containing material. In an embodiment, a depth of the trench into the substrate is less than a thickness of the substrate. In an embodiment, the method further includes, after performing the plasma dicing process, reducing the thickness of the substrate from a second side of the substrate facing away from the first passivation layer such that the trench extends through the substrate. In an embodiment, the method further includes, after removing the first portion of the first passivation layer and before performing the plasma dicing process: forming a second passivation layer over the first passivation layer, the second passivation layer extending continuously from the first device region to the second device region; and removing a second portion of the second passivation layer from the scribe line region. In an embodiment, after removing the second portion of the second passivation layer, a first sidewall of the first passivation layer facing the scribe line region has a first distance from the scribe line region, and a second sidewall of the second passivation layer closest to the first sidewall has a second distance from the scribe line region, wherein the first distance is different from the second distance.

In accordance with an embodiment, a semiconductor device includes: a substrate; electrical components in the substrate; an interconnect structure over the substrate and electrically coupled to the electrical components; a seal ring around the interconnect structure; a first passivation layer over the interconnect structure and the seal ring; and a dielectric layer over the first passivation layer, wherein there is a first lateral distance between a first sidewall of the first passivation layer closest to the seal ring and a sidewall of the dielectric layer closest to the seal ring. In an embodiment, the semiconductor device further includes a second passivation layer between the first passivation layer and the dielectric layer, wherein there is a second lateral distance between a second sidewall of the second passivation layer closest to the seal ring and the sidewall of the dielectric layer closest to the seal ring, wherein the first lateral distance is different from the second lateral distance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate;
   electrical components in the substrate;
   an interconnect structure over the substrate and electrically coupled to the electrical components;
   a seal ring around the interconnect structure;
   a first passivation layer over the interconnect structure and the seal ring;
   a dielectric layer over the first passivation layer, wherein there is a first lateral distance between a first sidewall of the first passivation layer closest to the seal ring and a sidewall of the dielectric layer closest to the seal ring; and
   a second passivation layer between the first passivation layer and the interconnect structure, wherein there is a second lateral distance between a second sidewall of the second passivation layer closest to the seal ring and the sidewall of the dielectric layer closest to the seal ring, wherein the first passivation layer extends along an upper surface of the second passivation layer distal from the substrate, and along the second sidewall of the second passivation layer.

2. The semiconductor device of claim 1, wherein the dielectric layer extends along an upper surface of the first passivation layer distal from the substrate, and along the first sidewall of the first passivation layer.

3. The semiconductor device of claim 2, wherein the sidewall of the dielectric layer is aligned with a respective sidewall of the substrate along a same line.

4. The semiconductor device of claim 1, further comprising a conductive pad between the first passivation layer and the second passivation layer, wherein the conductive pad has a protrusion that extends through the second passivation layer to electrically coupled to the interconnect structure.

5. The semiconductor device of claim 4, wherein the first passivation layer covers a first portion of the conductive pad, and exposes a second portion of the conductive pad.

6. The semiconductor device of claim 5, wherein the dielectric layer extends through the first passivation layer and contacts the second portion of the conductive pad.

7. The semiconductor device of claim 6, further comprising a via that extends through the dielectric layer, the first passivation layer, and the second passivation layer, and is electrically coupled to the interconnect structure.

8. The semiconductor device of claim 1, wherein the first lateral distance is different from the second lateral distance.

9. The semiconductor device of claim 8, wherein the first lateral distance is smaller than the second lateral distance.

10. A semiconductor device comprising:
    a substrate;
    electrical components in the substrate;
    an interconnect structure over the substrate and electrically coupled to the electrical components, wherein the interconnect structure comprises first dielectric layers and conductive features in the first dielectric layers;
    a first passivation layer over the interconnect structure;
    a conductive pad over the first passivation layer, wherein a portion of the conductive pad extends through the first passivation layer and is electrically coupled to the interconnect structure; and
    a second dielectric layer over the first passivation layer and the conductive pad, wherein a sidewall of the second dielectric layer is aligned with a respective sidewall of the first dielectric layers along a same line, wherein there is a lateral offset between the sidewall of the second dielectric layer and a sidewall of the first passivation layer closest to the sidewall of the second dielectric layer.

11. The semiconductor device of claim 10, wherein the first passivation layer extends along and covers a first portion of an upper surface of the first dielectric layers, wherein a second portion of the upper surface of the first dielectric layers is exposed by the first passivation layer.

12. The semiconductor device of claim 11, wherein the second dielectric layer extends along and partially covers the second portion of the upper surface of the first dielectric layers.

13. The semiconductor device of claim 11, further comprising a second passivation layer between the first passivation layer and the second dielectric layer, wherein the second passivation layer extends along an upper surface of the first passivation layer, along the sidewall of the first passivation layer, and along the second portion of the upper surface of the first dielectric layers.

14. The semiconductor device of claim 11, further comprising a seal ring in the first dielectric layers adjacent to the sidewall of the first dielectric layers, wherein the first passivation layer is closer to the sidewall of the first dielectric layers than the seal ring.

15. A semiconductor device comprising:
    a substrate having electrical components;
    an interconnect structure over the substrate and electrically coupled to the electrical components, wherein the interconnect structure comprises first dielectric layers and conductive features in the first dielectric layers, wherein a width of the first dielectric layers is a same as a width of the substrate;

a seal ring in the first dielectric layers adjacent to a first sidewall of the first dielectric layers;

a first passivation layer over the interconnect structure;

a conductive pad over the first passivation layer and electrically coupled to the interconnect structure; and a second dielectric layer over the first passivation layer and the conductive pad, wherein a second sidewall of the second dielectric layer is aligned with the first sidewall of the first dielectric layers along a same vertical line, wherein a third sidewall of the first passivation layer closest to the second sidewall of the second dielectric layer is laterally spaced apart from the second sidewall of the second dielectric layer.

16. The semiconductor device of claim 15, further comprising a second passivation layer between the first passivation layer and the second dielectric layer, wherein the second passivation layer extends along and covers the third sidewall of the first passivation layer.

17. The semiconductor device of claim 16, wherein a fourth sidewall of the second passivation layer closest to the second sidewall of the second dielectric layer is laterally spaced apart from the second sidewall of the second dielectric layer.

18. The semiconductor device of claim 17, wherein the second dielectric layer fills a space between the fourth sidewall of the second passivation layer and the second sidewall of the second dielectric layer.

19. The semiconductor device of claim 15, wherein the third sidewall of the first passivation layer is closer to the first sidewall of the first dielectric layers than the seal ring.

20. The semiconductor device of claim 15, further comprising a via that extends through the second dielectric layer and the first passivation layer, and is electrically coupled to the interconnect structure.

* * * * *